US010396520B2

(12) United States Patent
Larisch et al.

(10) Patent No.: US 10,396,520 B2
(45) Date of Patent: Aug. 27, 2019

(54) METHOD FOR CALIBRATING A MOUNTING DEVICE

(71) Applicant: Aptiv Technologies Limited, St. Michael (BB)

(72) Inventors: Markus Larisch, Wuppertal (DE); Achim Rosemann, Schwelm (DE); Rainer Bego-Ghina, Bochum (DE)

(73) Assignee: APTIV TECHNOLOGIES LIMITED (BB)

( * ) Notice: Subject to any disclaimer, the term of this patent is extended or adjusted under 35 U.S.C. 154(b) by 148 days.

(21) Appl. No.: 15/318,076

(22) PCT Filed: Jun. 15, 2015

(86) PCT No.: PCT/EP2015/063349
§ 371 (c)(1),
(2) Date: Dec. 12, 2016

(87) PCT Pub. No.: WO2015/193247
PCT Pub. Date: Dec. 23, 2015

(65) Prior Publication Data
US 2017/0117678 A1 Apr. 27, 2017

(30) Foreign Application Priority Data
Jun. 16, 2014 (EP) .................................... 14172587

(51) Int. Cl.
*H05K 3/30* (2006.01)
*H01R 43/20* (2006.01)

(52) U.S. Cl.
CPC .......... *H01R 43/20* (2013.01); *Y10T 29/4913* (2015.01)

(58) Field of Classification Search
CPC ................ H05K 13/08; H05K 13/046; H05K 2201/10984; H05K 3/32; H05K 2203/167;
(Continued)

(56) References Cited

U.S. PATENT DOCUMENTS 5,537,204 A * 7/1996 Woodhouse ......... H05K 13/089 356/243.1
5,806,753 A * 9/1998 Bielick ................... H01L 24/31 228/119

(Continued)

FOREIGN PATENT DOCUMENTS

CN 102738683 A 7/2008
CN 103682949 A 10/2012
DE 102007027877 A1 12/2008

*Primary Examiner* — Thiem D Phan
(74) *Attorney, Agent, or Firm* — Joseph Victor Bonadies

(57) ABSTRACT

A method for calibrating a mounting-device used for automatically mounting a contact-part attached to an electrical line with a connector-housing includes the steps of providing the mounting-device, marking a plurality of marking-points, capturing an image of the plurality of marking-points, and determining the positions of the plurality of marking-points. The mounting-device comprises a holder for the connector-housing, a positioning-device that includes a moveable-gripper that includes a marking-device, a camera configured to capture an image of a portion of the holder, and a control unit in communication with the positioning-device, the camera, and the moveable-gripper. The control unit determines the positions of the marking-points based on the image. The positions are indicative of an actual insertion-position of the contact-part into the connector-housing by the moveable-gripper. The control unit stores the positions of the marking-points in a memory of the control unit.

11 Claims, 4 Drawing Sheets

(58) Field of Classification Search
CPC .... H01R 43/20; H01R 12/613; H01R 25/003; H01L 2224/73265; Y10T 29/4913; Y10T 29/53174; Y10T 29/49829; Y10T 29/5193
USPC .......... 257/E21.499, E21.514, E21.599, 774; 29/740, 791, 832, 33 M, 430, 564.1, 739, 29/747, 834, 857
See application file for complete search history.

(56) References Cited

U.S. PATENT DOCUMENTS

| | | | | |
|---|---|---|---|---|
| 6,999,835 | B2 * | 2/2006 | Kodama ............ | G05B 19/4065 700/108 |
| 2009/0228144 | A1 | 9/2009 | Okazaki et al. | |

* cited by examiner

METHOD FOR CALIBRATING A MOUNTING DEVICE

CROSS-REFERENCE TO RELATED APPLICATION

This application claims the benefit under 35 U.S.C. § 371 of published PCT Patent Application Number PCT/EP 2015/063349, filed 15 Jun. 2015, claiming priority to European patent application number EP14172587.9 filed on 16 Jun. 2014, the entire contents of which is hereby incorporated by reference herein.

TECHNICAL FIELD OF INVENTION

This disclosure generally relates to a method for calibrating a mounting-device, and more particularly relates to a mounting-device which is configured for automatically mounting a connector housing with a contact-part attached to an electrical line.

BACKGROUND OF INVENTION

It is known that the machine-based manufacturing of electrical line harnesses is often carried out by the use of robots or similar positioning devices that are equipped with grippers as end effectors. Usually, such a gripper holds a contact-part either directly or at the electrical line, moves it to the desired cavity and inserts it therein. The term "connector housing" is basically meant to be also a socket housing, a clamping bar or the like. To ensure a reliable and efficient mounting process, an accurate knowledge of the positions of the respective components of the system is required.

For cost reasons, neither the connector housings nor the contact-parts of conventional electrical lines can be manufactured with strict tolerance allowances. Accordingly, inaccuracies regarding the positioning arise repeatedly when using common mounting-devices, whereby reliable and efficient operation is made difficult. An observation of the holder by a camera can help here only partially. In particular, position deviations of the gripper that arise only in the course of the positioning and insertion movement may not be considered by the camera in general.

DE 10 2007 027 877 A1 discloses a method for calibrating a setting head for contact elements, wherein a calibration plate is laterally movably mounted on a holder and subsequently a contact pin is inserted into a passage of the calibration plate. After the insertion process, the calibration plate is locked and the position of the passage is determined by the camera.

SUMMARY OF THE INVENTION

Described herein is a method for calibrating a mounting-device for automatically mounting a connector housing with a contact-part attached to an electrical line. It is an object of the invention, even when using positioning devices, connector housings, holders and/or contact-parts with tolerances, to allow for exact, error-free and fast mounting of a connector housing with a contact-part attached to an electrical line.

In accordance with one embodiment, a method for calibrating a mounting-device is provided. The method comprises the steps of :

(i) a marking carrier is attached to the holder, (ii) a marking-device is gripped with the movable gripper, (iii) a plurality of marking points is set on the marking carrier attached to the holder by way of the gripper and the marking-device gripped thereby, (iv) the positions of the marking points on the marking carrier are determined by a camera, and (v) the determined positions of the marking points are stored in a storage device associated with the control unit.

Since the marking points are set with the same movable gripper, with which the contact-parts are positioned and inserted during normal operation of the mounting-device, each marking point indicates exactly that position which is approached during the mounting process with respective control of the positioning system. Deviations of the displacement movement from a predetermined course are irrelevant herein. Regardless of the extent to which such deviations occur and how they arise, in any case such a marking point indicates the exact insertion position which results from the respective control of the positioning device.

During normal operation of the mounting-device, the stored positions of the marking points may be retrieved and taken into consideration in the calculation of the displacement movement of the gripper required for mounting. With the calibration method according to the invention, it is thus possible, within the machine control, to completely compensate for all mechanical tolerances and deviations of the mounting-device and of the provided connector housings and contact-parts. A particular benefit of the calibration method according to the invention is that it may be performed with the already provided camera.

Preferably, in step (iii), the gripper is moved with marking-device spaced from the marking carrier in a displacement plane transverse to the insertion direction in accordance with predetermined displacement coordinates of the positioning device to a marking position, respectively, wherein in step (v) the displacement coordinates together with the determined position of the associated marking point are stored in the storage device, respectively. Thus, the marking points are each assigned to those displacement coordinates on which their generation is based. In this configuration, not only the positions of the marking points are stored in the storage device, but also the respective causal control parameters. After completion of the calibration method, during normal operation of the mounting-device, it can be proceeded such that the suitable displacement coordinates or control parameters are located with predetermined insertion position.

Preferably, in step (iii), the gripper is moved respectively in the insertion direction towards the marking carrier, after the gripper has reached the marking position. In this way, each marking point is exactly set at the position at which a contact-part would be inserted, if it would be held by the gripper instead of the marking-device. Thus, the positions of the marking points are directly and immediately associated with insertion positions of contact-parts.

In another embodiment, the method provides that in step (iv) the positions of the marking points on the marking carrier are determined in relation to a reference-marking provided on the holder, identifiable by the camera. By using such a reference-marking, the positions of the marking points in relation to the holder can be determined particularly exact—even if the camera has various positions when determining the positions of the marking points on the marking carrier in step (iv).

In step (v), the position of the reference-marking can also be stored in the storage device. The stored position of the reference-marking can be used as reference value for other holders.

In yet another embodiment, the method provides that a reference-body, connected to the holder and preferably made of sheet metal, having at least one in particular punched or lasered recess, is provided as reference-marking. The detection of a sharply edged recess in a camera image is possible with relatively high accuracy with suitable illumination. A reference-body in the form of a lasered sheet metal is relatively inexpensive to produce. The edges of the recess can be detected from both sides of the reference-body, if necessary, regardless of whether the camera is in front of or behind the holder. To ensure a particularly reliable detection of the reference-marking, an arrangement of several recesses on the reference-body can be provided.

In yet another embodiment, the method provides that, in step (iii), the gripper is initially moved to the reference-marking and from there to the respective marking position. The positioning of the marking-device in relation to the reference-marking may be verified by the camera. In this way, the marking points are set in relation to the coordinate system of the holder.

In step (iii), the marking points can be set in rows or columns, preferably in a uniform distance from each other. In this way, lines with spaced marking points can be created on the marking carrier, which can be used similar to a scale for determining the position.

In particular, in step (iii), a grid-like array of points can be created on the marking carrier by repeatedly setting of marking points row-wise or column-wise, extending at least over a operation area of the holder holding the connector housing. By such a grid-like array of points, an entire area of the holder and, if necessary, even the entire holder can be included in the calibration.

Preferably, in step (i), a flat labeling medium is used as marking carrier, in particular a paper or foil element. Such a flat labeling medium can be easily attached to a front of the holder facing the gripper. To this end, suitable attachment method may be provided at the holder such as, for example, one or more clamping bars.

In step (ii), in particular a pin, a needle, a laser head or a thermal element can be used as marking-device. The use of a pin or needle is particularly cost-efficient. In contrast, the use of a laser head or thermal element allows for setting of particularly fine and/or structured marking points.

In yet another embodiment, the method provides that step (iii) is carried out at a mounting station of the mounting-device and step (iv) is carried out at a measuring station of the mounting-device separate from the mounting station. The provision of a measuring station and a separate mounting station at a mounting-device is procedurally advantageous. In particular, in such an embodiment, a contact-part can be inserted during normal operation, while at the measuring station a further holder with connector housing is already measured. Advantageously, both stations can be used for calibration of the system.

In yet another embodiment, the method provides that, in step (iv), the camera is successively moved to the individual marking points by way of a further positioning device, wherein the positions of the marking points on the marking carrier are each determined from the displacement position of the further positioning system and the position of the marking point in be the captured image. By individually approaching the marking points, the determination of a position of a marking point in the image can be made with very high resolution. For cost-efficiency, it is also possible, due to the individually approaching of the marking points, to use the camera with a comparatively low resolution.

It may be provided that the holder is configured for holding a plurality of connector housings, wherein in step (iii) the marking points are set such that at least two, preferably at least five, marking points are associated with each held connector housing. This ensures a sufficiently accurate consideration of any positional deviations.

The invention also relates to a mounting-device for automatically mounting a connector housing with a contact-part attached to an electrical line, which comprises a holder for the connector housing, a positioning device with a movable gripper for positioning the contact-part in relation to the holder and for inserting the contact-part in a direction of insertion into a cavity of the connector housing, the camera for capturing at least one spatially resolved image of at least part of the holder, and a control unit for determining a position of the cavity in the at least one spatially resolved image and for determining a movement of the gripper required for inserting the contact-part into the cavity using the determined position of the cavity.

According to the invention a control unit of the mounting-device is configured to carry out a calibration method as described above. Such a calibration function allows for reliable compensation of all tolerances and deviations of the entire system.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
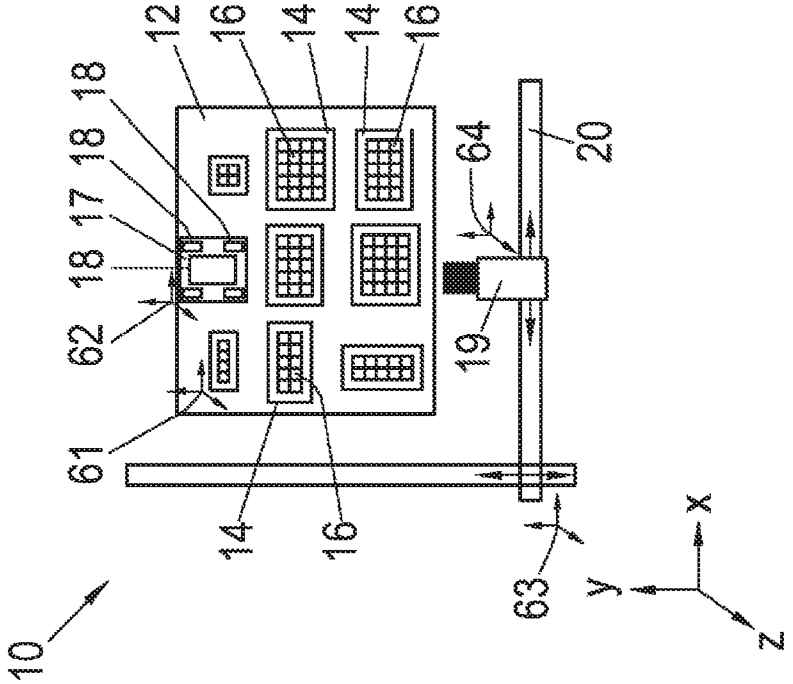
FIG. 1 depicts a measuring station of a mounting-device during normal operation in accordance with one embodiment.

The measuring station 10 shown in FIG. 1 forms the input part of a mounting-device according to the invention and includes a panel-like holder 12, to which a plurality of connector-housings 14 is fixed. The connector-housings 14, for example, may be locked in receptacles of the holder 12, optionally with the use of additional individual holders. A plurality of cavities 16 are respectively located at the rear sides of the connector-housings 14, in which contact-parts to be described below can be inserted. Further, a reference-body 17 of thin sheet metal is attached to the holder 12, into which a plurality of recesses 18 is lasered.

A first-camera 19 with associated image processing system (not shown) is provided to capture spatially resolved images of a part of the holder 12 including the connector-housings 14 fixed thereto. The first-camera 19 is attached to a camera-positioning-system 20 such that it may be positionally moved in front of the individual connector-housings 14. In the embodiment illustrated, the camera-positioning-system 20 is configured as a two-axis linear system. For reasons of clarity, the holder 12 with the fixed connector-housings 14 and the camera-positioning-system 20 are depicted in front view, while the first-camera 19 is shown in plan-view. The holder 12, the reference-body 17, the camera-positioning-system 20 and the first-camera 19 have assigned respective coordinate systems, which are shown as arrow arrangements in FIG. 1 and are designated with the reference numerals 61-64.

Figure 2:
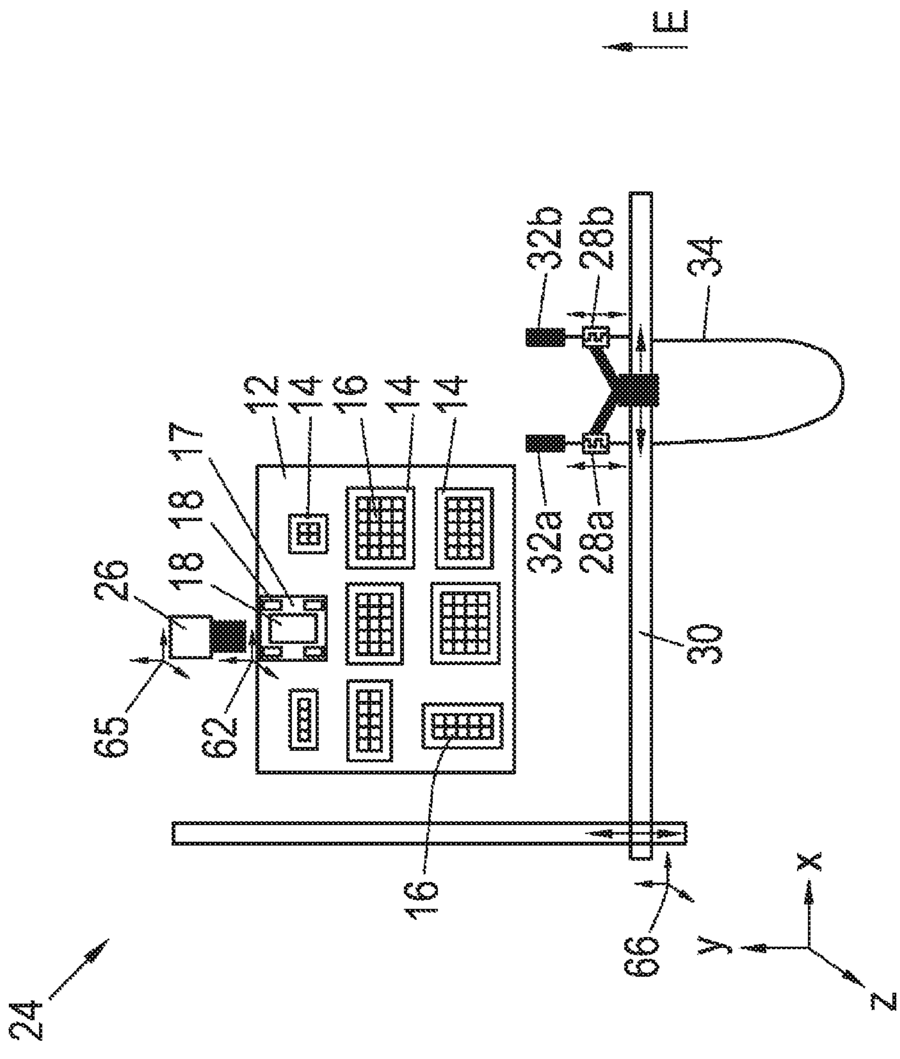
FIG. 2 depicts a mounting station of a mounting-device during normal operation in accordance with one embodiment.

The mounting-station 24 shown in FIG. 2 is associated with the same mounting-device as the measuring-station 10 shown in FIG. 1 and is preferably procedurally subordinate. The holder 12 shown in FIG. 1, including the fixed connector-housings 14, can be transported by way of a transport system, not shown, to the mounting-station 24. At the mounting-station 24, a second-camera 26 is provided including an image processing system, not shown. The second-camera 26 shown in plan-view is arranged behind the holder 12 shown in front-view—i.e. on the side facing away from the cavities 16—in the area of the reference-body 17, so that it has a view of the recesses 18 of the reference-body 17. In front of the holder 12 are two grippers (a first-gripper 28*a,* and a second-gripper 28*b*) which are combined to a double-gripper and are movable by a gripper-positioning-system 30. The camera-coordinate-system 65 of the second-camera 26 and the gripper-coordinate-system 66 of the gripper-positioning-system 30 are also shown as arrow arrangements in FIG. 2.

The gripper-positioning-system 30 is here configured as a linear system, wherein the grippers 28*a* and 28*b* are moveable along respective x-, y- and z-axes, both in and opposite to an insertion-direction E and also in a displacement plane extending at a right angle thereto. A robot could also be provided for moving the grippers 28*a* and 28*b* instead of the gripper-positioning-system 30. Each of the grippers 28*a* and 28*b* is configured for holding a first-contact-part 32*a* and a second-contact-part 32*b* via an electrical line 34 attached thereto. In the illustrated embodiment, both contact-parts 32*a* and 32*b* are interconnected by a common electrical line 34.

During normal operation of the mounting-device, respective prefabricated connector-housings 14 are initially locked into the associated receptacles of a holder 12, for example manually. Subsequently, the holder 12 with the fixed connector-housings 14 is transported to the measuring-station 10 (FIG. 1). The first-camera 19 is then automatically moved in front of the reference-body 17 by the camera-positioning-system 20. The image processing system associated with the first-camera 19 determines the position of the recesses 18 provided in the reference-body 17 and thus defines the position of the holder-coordinate-system 61 of the holder 12. Subsequently, the first-camera 19 is sequentially positioned in front of each connector-housing 14. The image processing system associated with the first-camera 19 determines each position and rotational position of the connector-housing 14. The relative positions of the individual cavities 16 in relation to the associated connector-housing 14 are taken from a database. Based on the position of the first-camera 19 in the displacement plane and the determined position of the connector-housing 14 in the image, the relative position of the connector-housing 14 in relation to the reference-body 17 is determined.

Upon completion of this measurement process, the holder 12 with the connector-housings 14 is transported to the mounting-station 24 (FIG. 2). Both grippers 28*a* and 28*b* grip respective contact-parts 32*a* and 32*b* at the common electrical line 34. The grippers 28*a* and 28*b* are moved by the gripper-positioning-system 30 to the center of the reference-body 17, behind which the second-camera 26 is located. The relative position of the first contact-part 32*a* in relation to the reference-body 17 and the holder-coordinate-system 61 of the holder 12 is determined by the image processing system associated with the second-camera 26. The necessary movement of the gripper 28*a* for mounting is then calculated by an electronic control-unit (not shown). The electrical line 34 with the first-contact-part 32*a* is then moved to the desired connector-housing 14 considering the determined relative position in relation to the reference-body 17 and the first-contact-part 32*a* is inserted into the associated cavity 16 in the insertion direction E. For the second-contact-part 32*b* on the other end of the electrical line 34, the method is repeated with the same process steps. For procedural optimization, the process steps for the two contact-parts 32*a* and 32*b* may be interleaved.

To ensure an error-free and efficient process of the above described normal operation of the mounting-device, an exact alignment of all coordinate systems 61-66 in relation to each other is very important. In particular, the coordinate systems 61-66 each need to be aligned orthogonally and at right angles to each other. In practice, this is achievable only with substantial effort.

Figure 3:
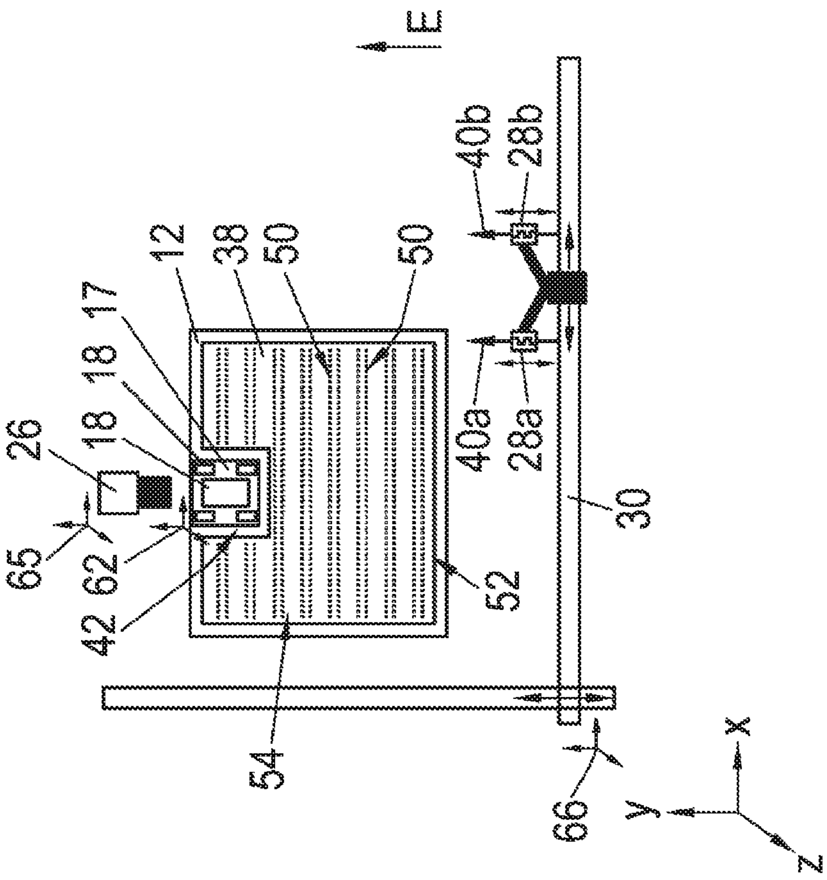
FIG. 3 depicts the mounting station of FIG. 2 during a calibration process in accordance with one embodiment.
Figure 4:
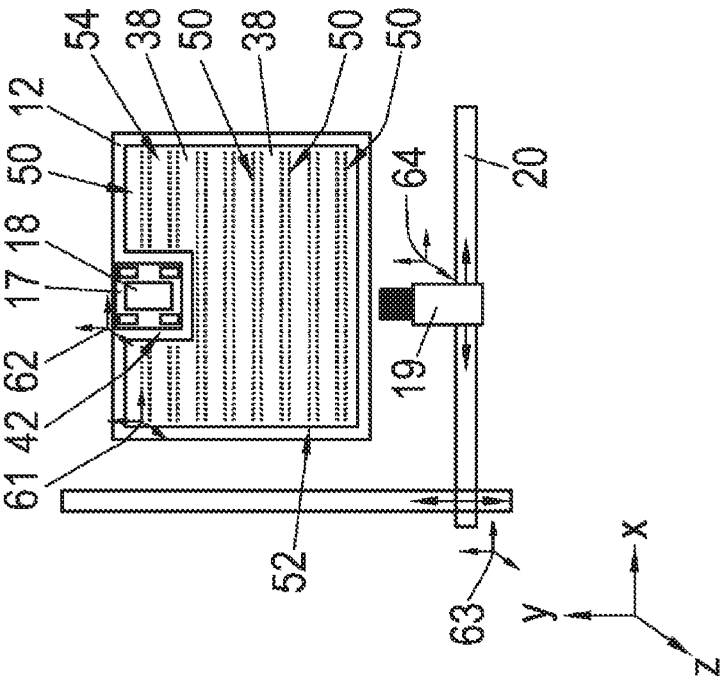
FIG. 4 depicts the measuring station of FIG. 1 during a calibration process in accordance with one embodiment.

For compensation of erroneous alignments of the individual coordinate systems 61-66, a method for calibrating the mounting-device is carried out, which will be described below in more detail with reference to FIGS. 3 and 4. Initially, a marking-carrier 38 is attached to the holder 12, for example in the form of a paper or foil element. To this end, suitable attachment device (not shown), such as one or more clamping bars may be provided on the holder 12. In the illustrated embodiment, the marking-carrier 38 covers essentially the entire front surface of the holder 12, however, a recess 42 is provided, which leaves a view of the reference-body 17.

The holder 12 with the attached marking-carrier 38 is optionally transported to the mounting-station 24 and placed in front of the second-camera 26. The camera-coordinate-system 65 of the second-camera 26 is aligned with the reference-body-coordinate-system 62 of the reference-body 17. Respective marking-device 40*a* and 40*b* instead of ends of the electrical line 34 are gripped by the grippers 28*a* and 28*b*. The marking-device 40*a* and 40*b* are generally shown as arrows in FIG. 3. In practice, the marking-device 40*a* and 40*b* in particular may be configured as pins, needles, laser heads or thermal elements.

The first-gripper 28*a* with the gripped marking-device 40*a* is moved to a reference point of the reference-body 17. According to the reference-body-coordinate-system 62 of the reference-body 17, the gripper 28*a* is first moved in the x direction, i.e. along a horizontal line. At a uniform distance of 10 mm, for example, the movement is stopped and the first-gripper 28*a* is moved in the insertion-direction E towards the marking-carrier 38 until the tip of the marking-device 40*a* contacts therewith and thus sets a marking-point 50. Subsequently, another row of marking-points 50 is created with altered vertical position. The row by row setting of marking-points 50 is repeated until the entire operation area 52 of the holder 12 is covered by a grid-like array of points 54.

After setting of all marking-points 50, the holder 12 with the attached marking-carrier 38 is moved to the measuring-station 10 (FIG. 1) and positioned in front of the first-camera 19. The first-camera 19 determines the position of the reference-body 17 and thus defines the holder-coordinate-system 61 of this specific holder 12. The position data are stored in a storage device of the control unit. They can be used as reference value for other holders 12. The first-camera 19 is then moved by the camera-positioning-system 20 sequentially to the individual marking-points 50 and the positions of the marking-points 50 on the marking-carrier 38 are each determined from the displacement position of the camera-positioning-system 20 and the position of the marking-point 50 in the captured image. The thus determined positions of the marking-points 50 are stored together with the displacement coordinates of the gripper-positioning-system 30 in the storage device, for example as table of values. Subsequently, the calibration method is repeated with the second-gripper 28*b* and its gripped marking-device 40*b*, wherein again the displacement coordinates of the gripper-positioning-system 30 and the corresponding positions of the marking-points 50 are commonly stored in the storage device.

At a subsequent normal operation of the mounting-device, the respective displacement coordinates of the gripper-positioning-system 30 can be determined from the positions of the connector-housings 14 at the holder 12 using the stored calibration data. Here, intermediate values can be determined by suitable mathematical methods, for example by an interpolation method. Any deviations from an orthogonal and linear movement of the grippers 28*a* and 28*b*, which for example lead to a trapezoidal, cushion-like or barrel-like distortion of the grid-like array of points 54, are determined by the calibration data and can be compensated accordingly in terms of control. If necessary, an examination of the calibration of the mounting-device may be carried out at any time. Both the normal operation and the calibration are coordinated by the above described control unit of the mounting-device.

Accordingly, a method for calibrating a mounting-device is provided. The method enables a reliable and cost-effective calibration of the entire mounting-device.

While this invention has been described in terms of the preferred embodiments thereof, it is not intended to be so limited, but rather only to the extent set forth in the claims that follow.

The invention claimed is:

1. A method for calibrating a mounting-device;

said mounting-device used for automatically mounting a contact-part into a connector-housing;

said contact-part attached to an electrical line;

said connector-housing defining a cavity into which the contact-part is inserted;

said method comprising the steps of:

providing the mounting-device which comprises:

a holder for the connector-housing;

the holder having a marking-carrier attached thereto, a positioning-device that includes a moveable-gripper;

the movable-gripper including a marking-device;

the movable-gripper configured to insert the contact-part into the connector-housing;

a camera configured to capture an image of a portion of the holder; and a control unit in communication with the positioning-device, the camera, and the moveable-gripper, said control unit configured to:

determine a position of the cavity based on the image; and control the positioning-device such that the moveable-gripper inserts the contact-part into the cavity;

marking a plurality of marking-points on the marking-carrier using the marking-device, wherein the moveable-gripper is sequentially positioned based on predetermined coordinates stored in the control unit;

capturing the image of the plurality of the marking-points using the camera;

determining positions of the plurality of the marking-points based on the image using the control unit;

said positions indicative of an actual insertion-position of the contact-part into the connector-housing by the moveable-gripper; and storing the positions of the plurality of the marking-points in a memory of the control unit.

2. The method according to claim 1, further comprising the step of moving the moveable-gripper with the marking-device spaced apart from the marking-carrier in a displacement direction transverse to a marking-position.

3. The method according to claim 2, further comprising the step of moving the moveable-gripper in an insertion-direction towards the marking-carrier after the moveable-gripper has reached the marking-position.

4. The method according to claim 3, further comprising the step of determining the positions of the marking-points on the marking-carrier in relation to a reference-marking provided on the holder, said reference-marking identifiable by the camera.

5. The method according to claim 4, further comprising the step of storing the position of the reference-marking in the memory.

6. The method according to claim 5, wherein the marking-carrier includes a reference-body to the formed of sheet metal attached thereto, said reference-body defining a reference indicia selected from one of a punched recess and a lasered recess.

7. The method according to claim 6, further comprising the step of moving the moveable-gripper to the reference-marking followed by the step of moving the moveable-gripper to the respective marking-position.

8. The method according to claim 7, further comprising the step of marking the marking-points in rows and columns at a uniform distance from each other.

9. The method according to claim 8, further comprising the step of marking a grid-like array of points on the marking-carrier by repeated row-wise and column-wise marking of the marking-points extending across an operation-area of the holder.

10. The method according to claim 1, wherein the marking-carrier is marked at a mounting-station of the mounting-device, and wherein the step of determining the positions of the marking-points is performed at a measuring-station of the mounting-device separate from the mounting-station.

11. The method according to claim 10, wherein the camera is successively moved to the individual marking-points by a camera-positioning-system during the step of capturing the image of the plurality of the marking-points using the camera, wherein the positions of the marking-points on the marking-carrier are each determined from a displacement-position of the camera-positioning-system and the position of the marking-point in the captured image.

* * * * *